(12) United States Patent
Mangold

(10) Patent No.: US 7,250,673 B2
(45) Date of Patent: Jul. 31, 2007

(54) SIGNAL ISOLATION IN A PACKAGE SUBSTRATE

(75) Inventor: Tobias Mangold, Weilheim (DE)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 11/146,817

(22) Filed: Jun. 6, 2005

(65) Prior Publication Data

US 2006/0286711 A1 Dec. 21, 2006

(51) Int. Cl.
H01L 23/48 (2006.01)
H01L 23/52 (2006.01)
H01L 23/495 (2006.01)
H01L 23/12 (2006.01)
H01L 29/40 (2006.01)

(52) U.S. Cl. .............. 257/691; 257/670; 257/678; 257/684; 257/690; 257/698; 257/700; 257/702; 257/707; 257/734; 257/736; 257/789

(58) Field of Classification Search .......... 257/670, 257/678, 684, 698, 700, 702, 707, 786, 690–691, 257/734, 736
See application file for complete search history.

(56) References Cited

U.S. PATENT DOCUMENTS

| | | | | |
|---|---|---|---|---|
| 5,708,567 A | * | 1/1998 | Shim et al. | 361/723 |
| 6,534,859 B1 | * | 3/2003 | Shim et al. | 257/706 |
| 6,791,166 B1 | * | 9/2004 | Foster | 257/666 |
| 6,803,659 B2 | * | 10/2004 | Suwa et al. | 257/738 |
| 6,853,202 B1 | * | 2/2005 | Chang et al. | 324/691 |
| 6,979,897 B2 | * | 12/2005 | Ma | 257/691 |
| 7,148,554 B2 | * | 12/2006 | Nah et al. | 257/532 |
| 2002/0076919 A1 | * | 6/2002 | Peters et al. | 438/637 |
| 2002/0084524 A1 | * | 7/2002 | Roh et al. | 257/738 |
| 2003/0057545 A1 | * | 3/2003 | Shim et al. | 257/706 |
| 2003/0216024 A1 | * | 11/2003 | Shim et al. | 438/613 |
| 2004/0155322 A1 | * | 8/2004 | Cho et al. | 257/676 |
| 2004/0173896 A1 | * | 9/2004 | Jiang et al. | 257/696 |
| 2005/0077545 A1 | * | 4/2005 | Zhao et al. | 257/202 |
| 2005/0194698 A1 | * | 9/2005 | Shim et al. | 257/784 |

* cited by examiner

Primary Examiner—Ida M. Soward

(57) ABSTRACT

Signal traces are patterned on a top surface of a substrate. A ground trace is patterned on the top surface of the substrate for at least one pair of the signal traces. A die paddle is patterned on the top surface of the substrate, and the die paddle is connected directly with the ground trace.

22 Claims, 6 Drawing Sheets

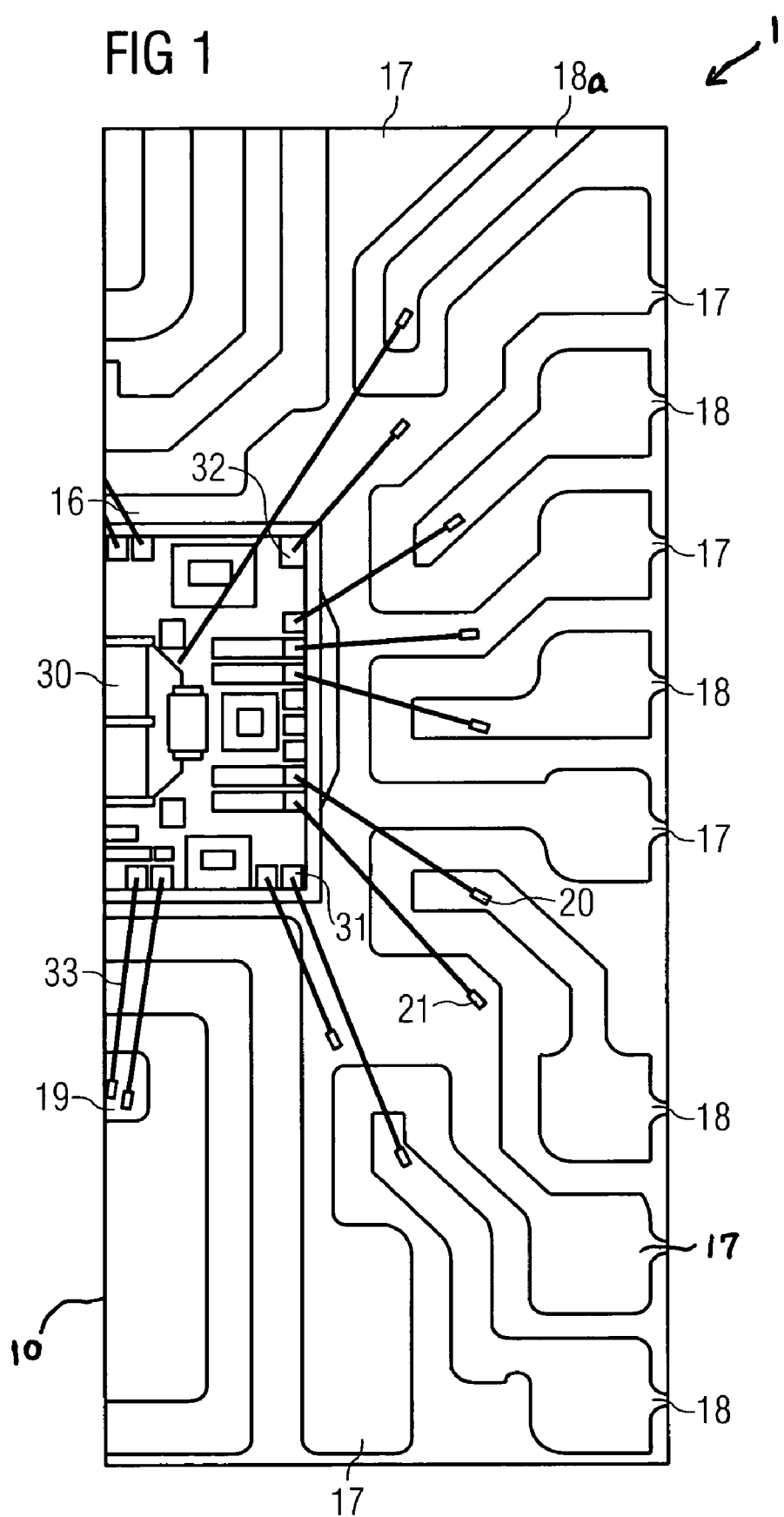

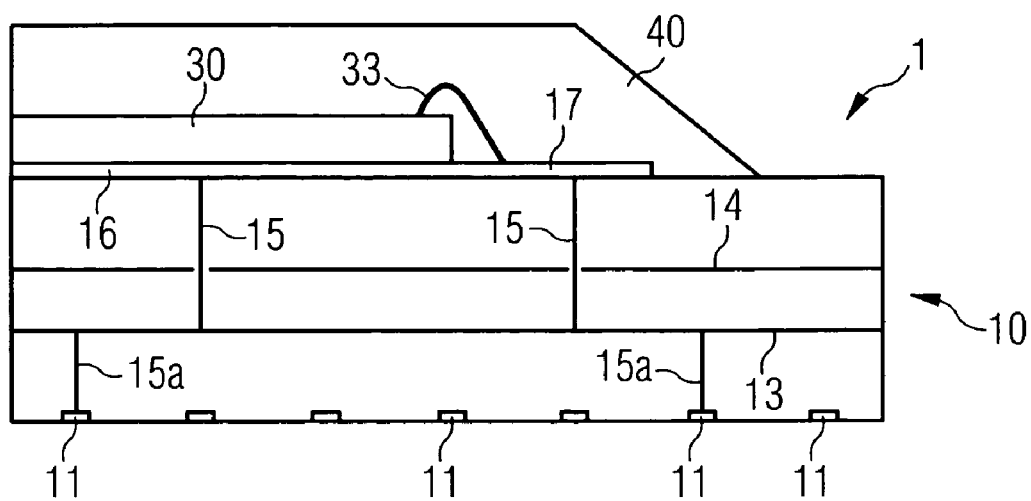
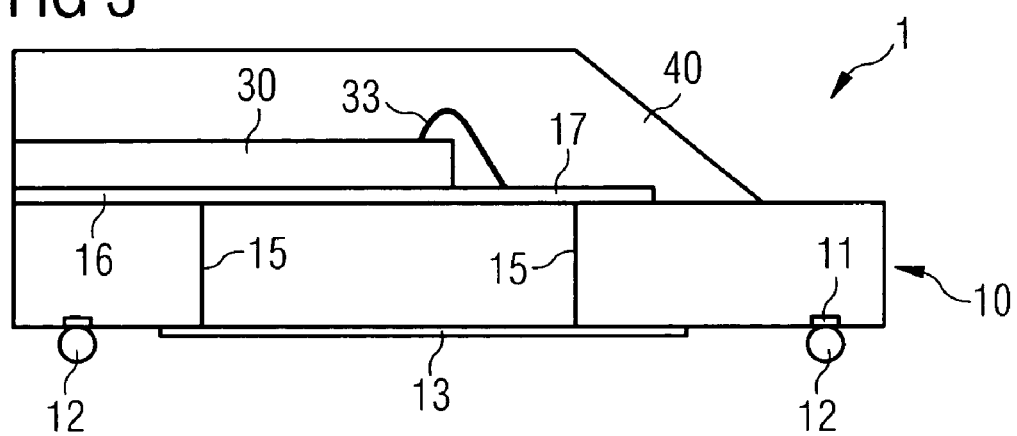
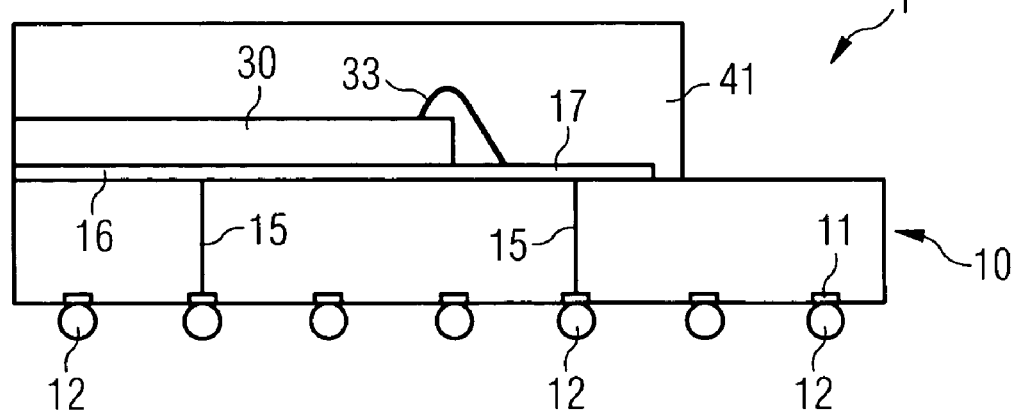

SIGNAL ISOLATION IN A PACKAGE SUBSTRATE

FIELD OF THE INVENTION

The present invention relates to semiconductors, and more particularly to signal isolation in a package substrate.

BACKGROUND OF THE INVENTION

Transmit modules, also known more generally as front-end modules, in wireless communication systems such as GSM/CDMA or mixed-mode handsets or WLAN transceivers, support various frequency bands and/or various modulation schemes. This results in multiple ports, referred to herein as radio frequency (RF) ports, through which signals pass to integrated circuits in the RF portion of the wireless communication system.

The continuing miniaturization of electronic components in wireless communication systems can result in RF ports that are located in close proximity to one another. RF ports located in close proximity to one another can result in poor signal isolation, which can result in, for example, cross talk and electrical noise that affect signal integrity.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 1 is a schematic diagram of a packaged microelectronic device according to one embodiment of the invention.

FIG. 2 is a cross section of a packaged microelectronic device according to one embodiment of the invention.

FIG. 3 is a cross section of a packaged microelectronic device according to another embodiment of the invention.

FIG. 4 is a cross section of a packaged microelectronic device according to yet another embodiment of the invention.

DETAILED DESCRIPTION

Figure 5:
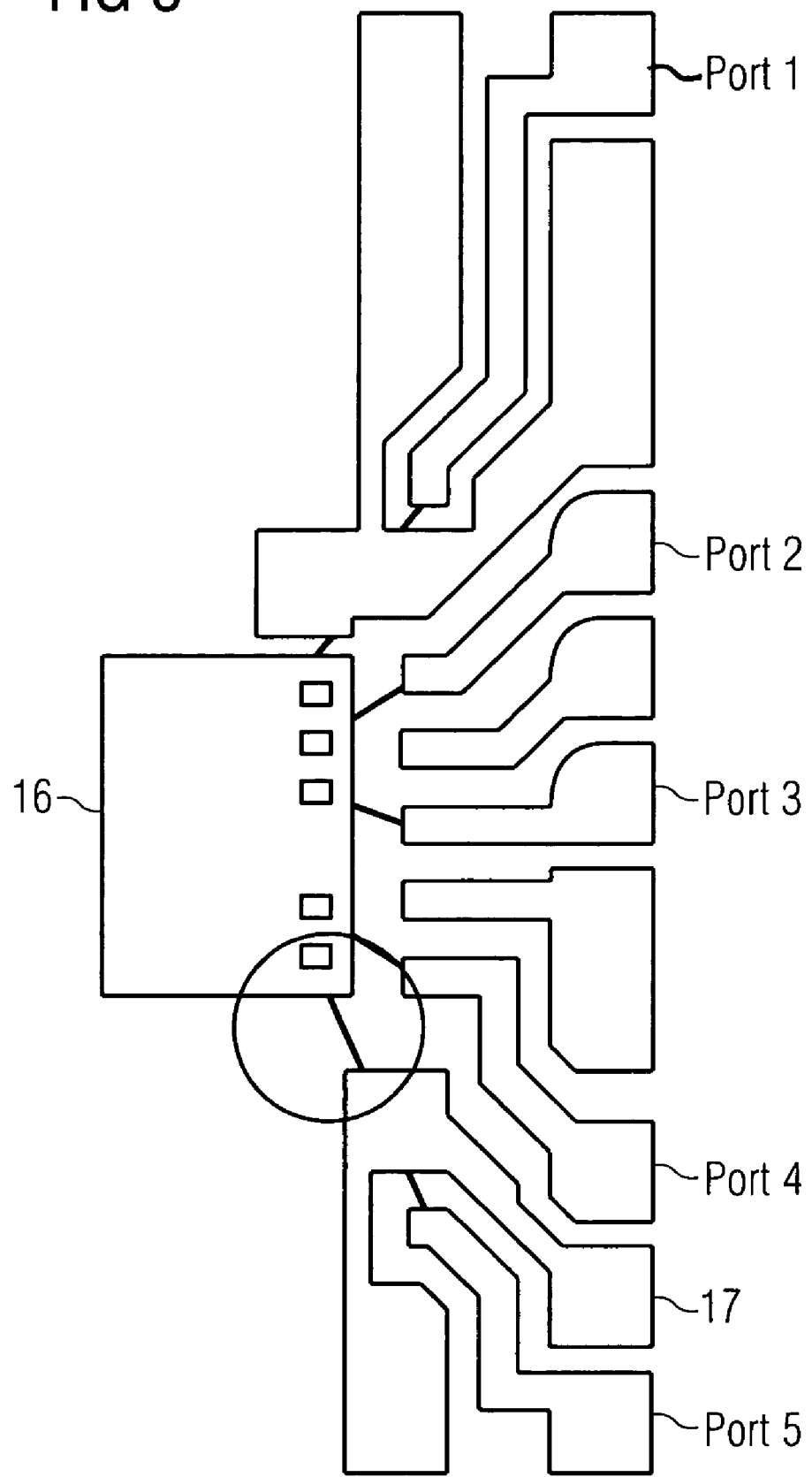
FIG. 5 is a comparative example wherein a ground trace is not connected directly with a die paddle.

In the following description, for purposes of explanation, numerous specific details are set forth. It will be apparent, however, to one skilled in the art that embodiments of the invention can be practiced without these specific details. In other instances, structures and devices may be shown in block diagram form in order to avoid obscuring the understanding of this description.

FIG. 1 is a schematic diagram of a packaged microelectronic device according to one embodiment of the invention. Packaged microelectronic device 1 includes a package substrate 10 having a top surface and a bottom surface. The top surface of package substrate 10 includes a plurality of RF ports represented by a plurality of signal traces 18, which pass signals to integrated circuit die 30 located on the top surface of package substrate 10. The top surface of package substrate 10 also includes one or more signal traces 18*a*, which connects integrated circuit die 30 with an antenna (not shown).

The top surface of package substrate 10 further includes a ground trace 17 for pairs of signal traces 18 (or for a signal-trace pair that includes a signal trace 18 and a signal trace 18*a*) to provide greater isolation between signals transmitted through the signal traces, thereby increasing noise shielding and reducing cross talk between the pair of signal traces. The ground trace can be placed between the pair of signal traces, and/or can be placed next to one of the signal traces, on the side opposite the other signal trace, where the ground trace is sufficiently close to the signal trace to act as a ground reference for the signal being transmitted through the signal trace. Although embodiments of the invention are described in terms of having a ground trace for each pair of signal traces, embodiments of the invention may be practiced with having a ground trace for fewer than each pair of signal traces, or with more than one ground trace for a pair of signal traces.

As stated above, signal trace 18*a* connects integrated circuit die 30 with an antenna (not shown). Depending on the frequency band and/or the modulation scheme of the signal coming from the antenna, integrated circuit die 30 switches the signal to a predetermined signal trace 18, which passes the signal to RF integrated circuits (not shown). Accordingly, the signal traces form multiple RF ports to the RF integrated circuits.

The continuing miniaturization of the electronic components results in RF ports that are located in close proximity to each other. RF ports located in close proximity to one another can result in poor signal isolation, which can result in, for example, cross talk and electrical noise that affect signal integrity. To increase signal isolation, a ground trace 17 is provided for each pair of signal traces for which signal isolation is desired.

The top surface of package substrate 10 further includes a conductive die paddle 16 (or simply a die paddle 16), that is connected directly with the ground traces 17. This enables die paddle 16 and ground trace 17 to act as a current path for, e.g., ground currents. In one embodiment, die paddle 16 is connected with ground traces 17 by a direct, low impedance electrical connection between die paddle 16 and ground trace 17. This may be achieved, by way of example, and not by way of limitation, by integrally forming die paddle 16 with a ground trace 17, or otherwise directly connecting die paddle 16 with a ground trace 17. In another embodiment, die paddle 16 is connected with ground traces 17 using a conductive material or element between die paddle 16 and ground trace 17, thus providing a direct electrical connection between die paddle 16 and ground trace 17. In one embodiment, die paddle 16 is connected directly with ground trace 17 on the top surface of package substrate 10. In another embodiment, die paddle 16 is connected directly with ground trace 17 on other than the top surface of package substrate 10, for example, die paddle 16 is located on the top surface of package substrate 10, while ground trace 17 is not on the top surface of package substrate 10, or ground trace 17 is located on the top surface of package substrate 10, while die paddle 16 is not on the top surface of package substrate 10.

In conventional RF packaging and interconnect technologies, ground currents of diverse RF ports are routed through a common ground path, typically consisting of via holes (see, for example, vias 15 in FIG. 2) in a die paddle, to the ground plane on the backside of a semiconductor device.

Use of common ground path typically results in a common ground inductance for all of the RF ports, which reduces signal isolation.

Connecting die paddle 16 directly with ground traces 17 reduces the amount of ground current flowing through the die paddle vias into package substrate 10, since the ground current for each signal trace can flow through die paddle 16 and a ground trace 17, or some can flow through die paddle 16 and a ground trace 17 and some can flow through the die paddle vias. As a result, common ground inductance is reduced, thereby increasing signal isolation, because all of the RF ports are not using the same ground path. Thus, although greater signal isolation between RF ports can be achieved by including ground traces 17 with pairs of signal traces, connecting die paddle 16 directly with ground traces 17 can result in even greater signal isolation.

Package substrate 10 also includes power trace 19 to provide power to integrated circuit die 30. Thus, the embodiment shown in FIG. 1 illustrates an active integrated circuit die 30 that requires a power supply. However, embodiments of the present invention are not limited to active dies but may also be used with passive dies that do not require a power supply.

Integrated circuit die 30 includes signal pads 31 connected with signal traces 18 on package substrate 10, and ground pads 32 connected with ground traces 17 on package substrate 10. Because there is a ground trace on substrate 10 for each pair of signal traces for which signal isolation is desired, one corresponding ground pad 32 is provided on integrated circuit die 30 for each pair of signal pads 31 on integrated circuit 30 that corresponds to the pair of signal traces on package substrate 10 for which signal isolation is desired.

Bond wires 33 are used to connect semiconductor die 30 with signal traces 18 and 18a, ground traces 17 and power trace 19 on substrate 10. For purposes of illustration and ease of explanation, embodiments of the invention are described in terms of bond wires 33. However, embodiments of the invention are not limited to using bond wires to connect semiconductor die 30 with other components. Any technique known in the art may be used to connect semiconductor die 30 with components on package substrate 10.

Using a separate bond wire 33 for each ground return path, the area spanned by bond wires is kept small at each RF port, and adjacent land points 20 for signal bond wires and 21 for corresponding ground bond wires reduces the opportunity for electromagnetic coupling between RF ports, thereby increasing signal isolation. Similarly, while signal pads 31 and ground pads 32 may be located anywhere on integrated circuit die 30, placing such pads on the edge of integrated circuit die 30 allows for shorter bond wires, which reduces the opportunity for electromagnetic coupling between RF ports, thereby increasing signal isolation.

FIG. 2 is a cross section of a packaged microelectronic device according to one embodiment of the invention. Packaged microelectronic device 1 includes a package substrate 10 having a top surface and a bottom surface. The top surface of package substrate 10 includes a plurality of signal traces (not shown). Furthermore, a ground trace 17 is formed on the top surface of package substrate 10 between two signal traces. A die paddle 16 for supporting integrated circuit die 30 is patterned and connected directly with ground trace 17.

In order to provide connections with other components (not shown), contact pads 11 are provided on the bottom surface of package substrate 10. Using any solder technology known in the art, contact pads 11 can be used to connect package substrate 10 with a printed circuit board (not shown).

A ground reference plane 13 is provided within package substrate 10. Package substrate 10 includes vias 15 to connect ground trace 17 and die paddle 16 with ground reference plane 13. Additional vias 15a are used to connect ground reference plane 13 with corresponding contact pads 11 on the bottom surface of package substrate 10. In addition to ground reference plane 13, a power plane 14 is provided within package substrate 10, which includes a via (not shown) to connect a power trace (not shown) with power plane 14.

Protective material 40 is used to encapsulate integrated circuit die 30 and bond wires 33, and all or a portion of package substrate 10, so that packaged microelectronic device 1 can be used in, for example, a surface mount device ("SMD")-like fashion for the fabrication of larger communication systems. Protective material 40 may be any protective material known in the art.

FIG. 3 is a cross section of a packaged microelectronic device according to another embodiment of the invention. In contrast to the embodiment shown in FIG. 2, the embodiment shown in FIG. 3 does not include a ground reference plane or power plane within package substrate 10. Instead, ground reference plane 13 is provided on the bottom surface of package substrate 10. Vias 15 which connect ground trace 17 and die paddle 16 with ground reference plane 13 now extend through package substrate 10. Furthermore, any solder technology known in the art, for example, solder balls 12, in contact with the contact pads 11 can be used to connect package substrate 10 with a printed circuit board (not shown).

FIG. 4 is a cross section of a packaged microelectronic device according to yet another embodiment of the invention. In contrast to the embodiment shown in FIG. 3, the embodiment shown in FIG. 4 does not include a ground reference plane. Instead, vias 15 connect ground trace 17 and die paddle 16 with corresponding ground contact pads 11. The ground reference plane may be provided on a printed circuit board (not shown). Any solder technology known in the art, for example, solder balls 12, in contact with the contact pads 111 can be used to connect package substrate 10 with a printed circuit board (not shown).

Protective cap 41 is included on the top surface of the substrate 10 in an air-tight manner, for example, to encapsulate integrated circuit die 30, bond wires 33 and all or a portion of package substrate 10. Other embodiments of the invention described in terms of protective material 40 may also or instead use protective cap 41, and embodiments described in terms of protective cap 41 may also or instead use protective material 40.

FIG. 5 is a comparative example of a packaged microelectronic device wherein a ground trace is not connected directly with a die paddle. The example shown in FIG. 5 includes five signal traces of a substrate identified as Ports 1 to 5, which are connected to corresponding signal pads of an integrated circuit die (not shown in FIG. 5). Ports 4 and 5 are a pair of signal traces for which signal isolation is desired. In order to provide signal isolation for Ports 4 and 5, ground trace 17 is included between Ports 4 and 5. However, ground trace 17 in FIG. 5 is not connected directly with die paddle 16 as shown in FIG. 1.

Figure 6:
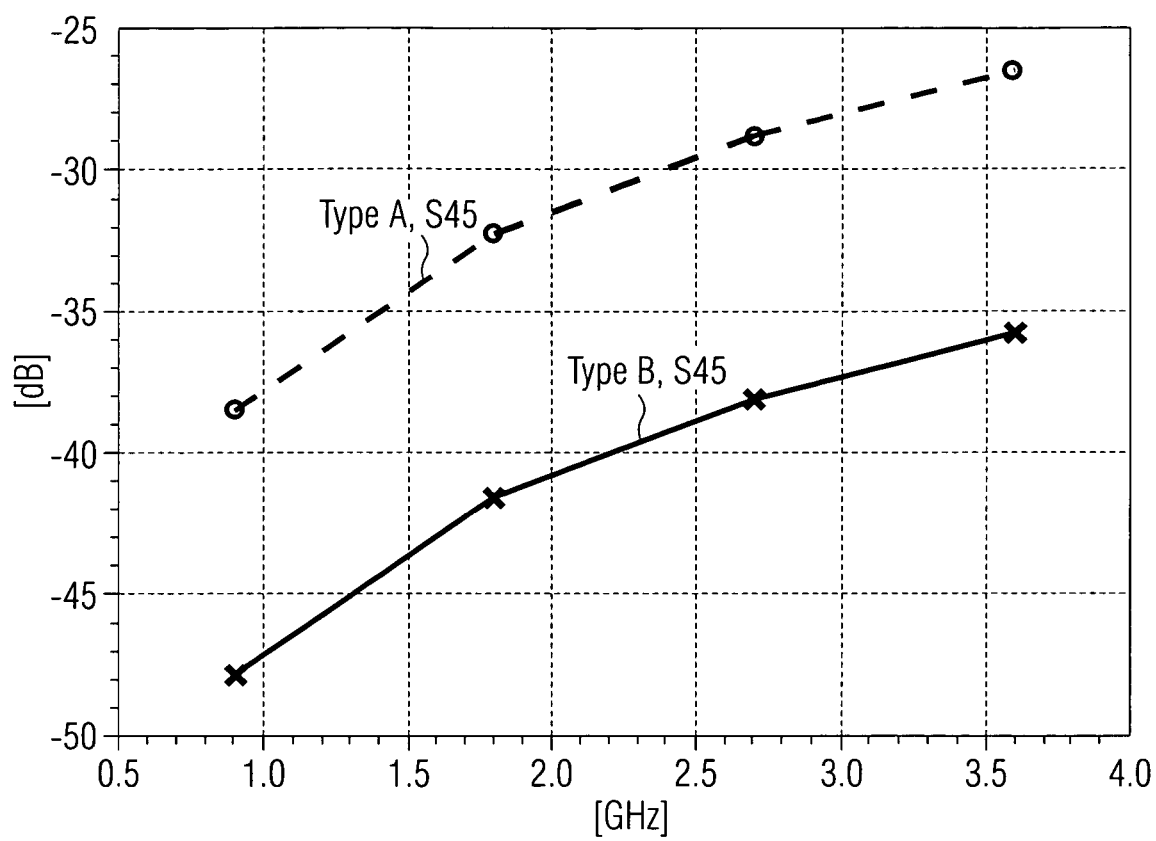
FIG. 6 shows the results of a simulation comparing signal isolations.

FIG. 6 shows the signal isolation, represented by an S-parameter $S_{45}$, for the device shown in FIG. 5 (Type A curve) and a packaged microelectronic device, for example, the device shown in FIG. 1 (Type B curve). The Type B curve shows greater signal isolation (about 8–10 dB in this example) than the Type A curve over the frequency range from 0.9 GHz to 3.6 GHz. Thus, the signal isolation in the device shown in FIG. 5, where the ground trace is not connected directly with the die paddle as shown in FIG. 1, is lower than the signal isolation in the packaged microelectronic device shown in FIG. 1.

Figure 7:
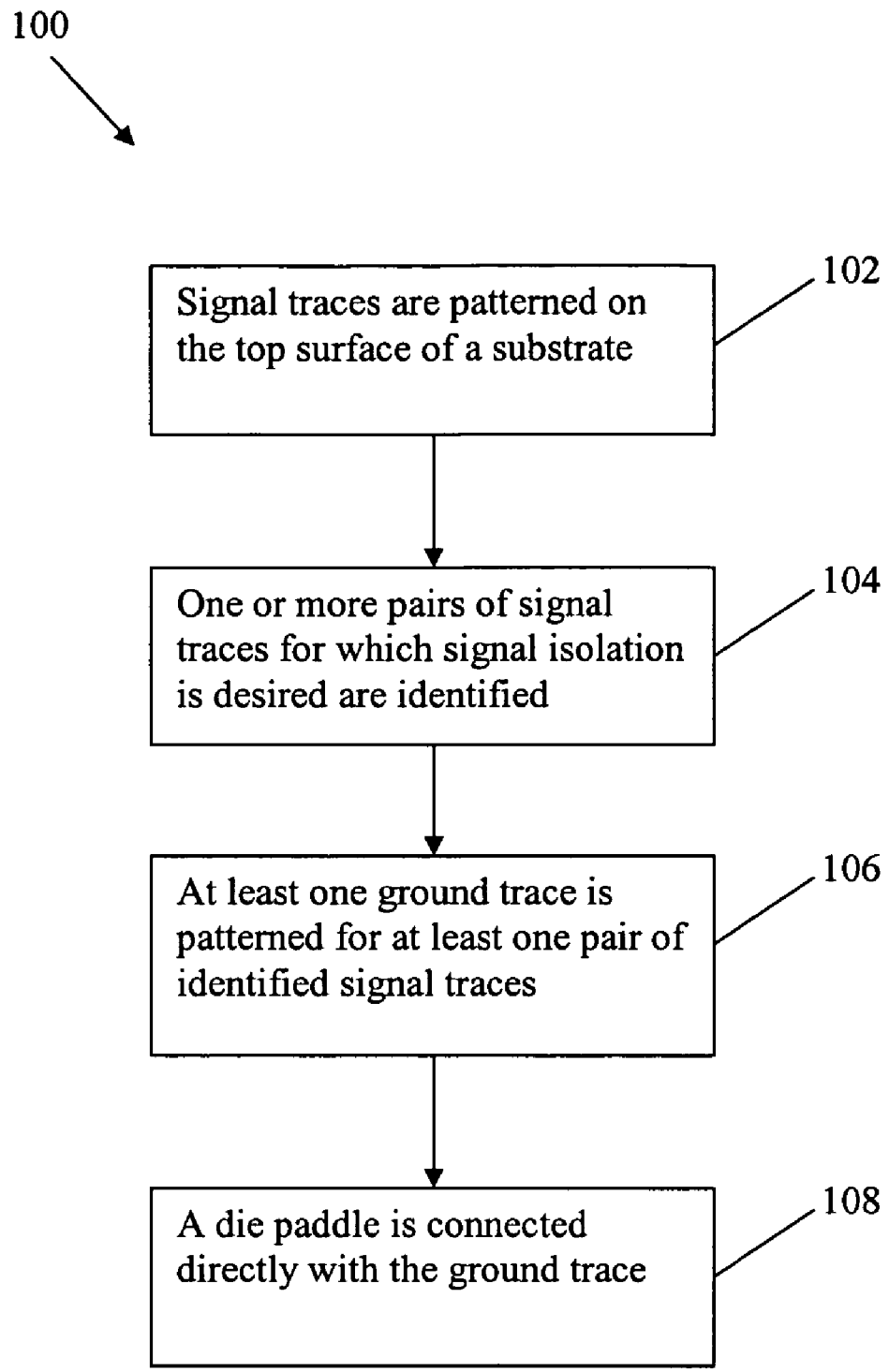
FIG. 7 is a flow chart of a method of fabricating a package substrate according to an embodiment the invention.

FIG. 7 is a flow chart of a method for fabricating a package substrate according to an embodiment of the invention. At 102 of method 100, signal traces are patterned on the top surface of a substrate. At 104, one or more pairs of signal traces for which signal isolation is desired are identified, and at 106 at least one ground trace is patterned for at least one pair of identified signal traces. At 108, a die paddle is connected directly with the ground trace. The resulting package substrate may be used in a subsequent method for fabricating a packaged microelectronic device.

It is emphasized that 102 to 108 of method 100 are not required to be executed in the described order. It is possible, for example, that identification of the signal traces for which signal isolation is desired at 104 has occured during the design phase of the package substrate, and that 102, 106, and 108 occur during the fabrication of the package substrate.

Figure 8:
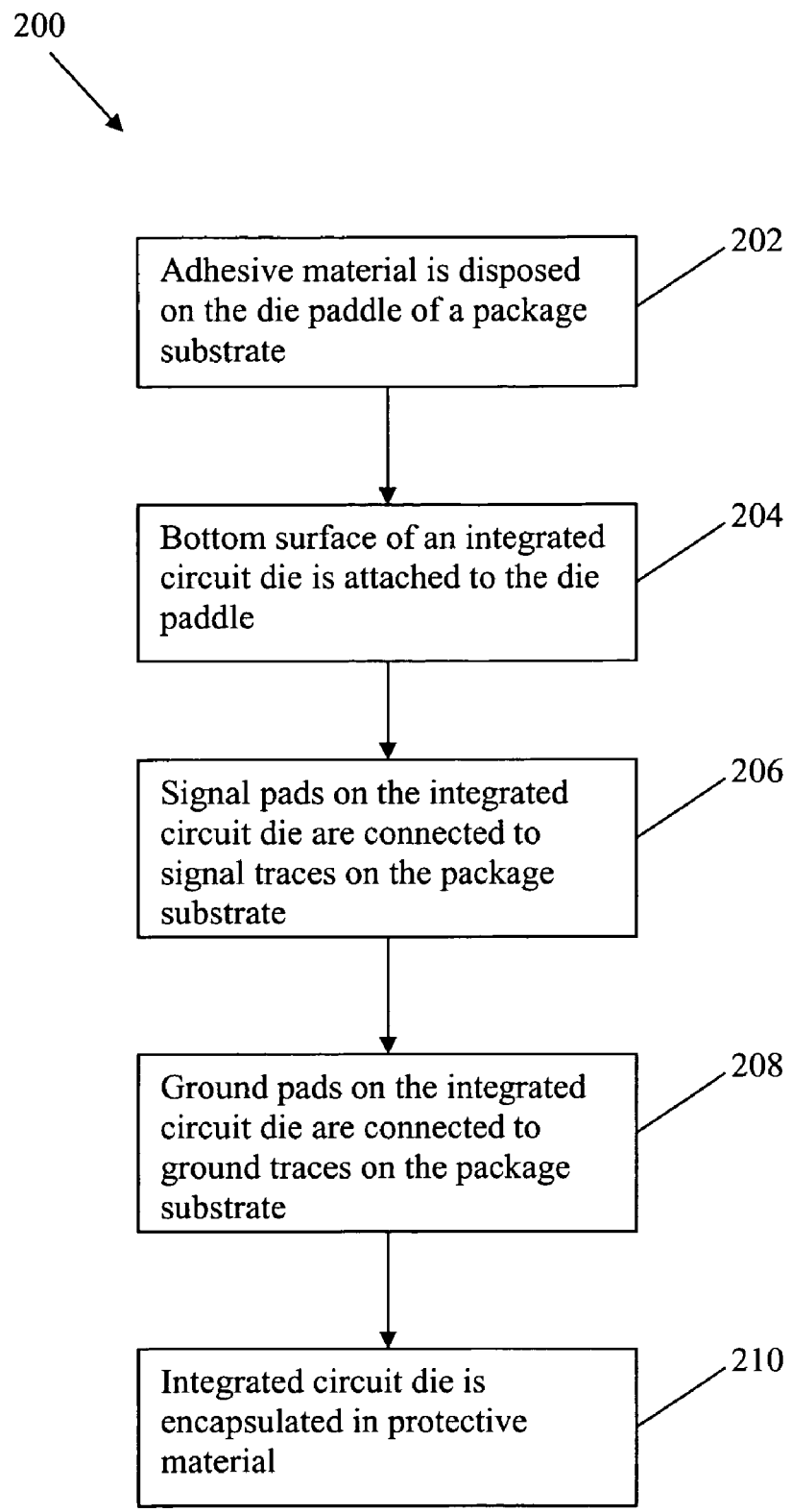
FIG. 8 is a flow chart of a method for fabricating a packaged microelectronic device according to an embodiment of the invention.

FIG. 8 is a flow chart of a method for fabricating a packaged microelectronic device according to an embodiment of the invention. At 202 of method 200, an adhesive material is disposed on the die paddle of a package substrate, for example, a package substrate produced using method 100 shown in FIG. 7. At 204, a bottom surface of an integrated circuit die is attached to the die paddle. At 206, signal pads on the integrated circuit die are connected to signal traces on the package substrate. At 208, ground pads on the integrated circuit die are connected to the ground traces on the package substrate and, at 210, the integrated circuit die is encapsulated in protective material. It is emphasized that 200 to 210 shown in FIG. 8 are not required to be executed in the described order. It is possible, for example, that 206 and 208 occur in the reverse order.

The present invention enables the manufacturing of package substrates and packaged microelectronic devices for a variety of applications, including for example but not limited to, wireless communication systems, including for example but not limited to, GSM/CDMA or mixed-mode handsets or WLAN transceivers.

Reference in the foregoing specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Although embodiments of the present invention and their advantages have been described in detail, it should be understood that various changes, substitutions, and alterations can be made therein without departing from the spirit and scope of the invention as defined by the appended claims. In the foregoing specification, the invention has been described with reference to specific embodiments thereof. It will, however, be evident that various modifications and changes can be made thereto without departing from the broader spirit and scope of the invention. The specification and drawings are, accordingly, to be regarded in an illustrative rather than a restrictive sense. Other variations and modifications of the concepts described herein may be utilized and fall within the scope of the claims below.

What is claimed is:

1. A package substrate, comprising:
a plurality of signal traces on a top surface of a substrate;
a ground trace on the top surface for at least one pair of signal traces;
a die paddle to support an integrated circuit die, said die paddle being connected directly with the ground trace;
contact pads on a bottom surface of the substrate;
a via to connect the ground trace to a first contact pad; and
a die paddle via to connect the die paddle to a second contact pad.

2. The package substrate of claim 1, wherein the ground trace on the top surface for the pair of signal traces comprises a ground trace between the signal traces of the pair.

3. The package substrate of claim 1, wherein the die paddle being connected directly with the ground trace comprises the die paddle being connected directly with the ground trace on the top surface of the substrate.

4. The package substrate of claim 1, wherein the die paddle being connected directly with the ground trace comprises the die paddle being integrally formed with the signal trace.

5. The package substrate of claim 1, wherein said die paddle being connected directly with the ground trace comprises a conductive material between the ground trace and the signal trace.

6. A packaged microelectronic device, comprising:
a package substrate having a top surface and a bottom surface, said package substrate comprising:
a plurality of signal traces on the top surface;
a ground trace on the top surface for at least one pair of signal traces; and
a die paddle connected directly with the ground trace; and
an integrated circuit die attached to the die paddle, said integrated circuit die comprising:
signal pads connected to the signal traces; and
a ground pad connected to the ground trace.

7. The packaged microelectronic device of claim 6 wherein the ground pad is between the signal pads.

8. The packaged microelectronic device of claim 6 wherein the signal pads are located close to an edge of the integrated circuit die.

9. The packaged microelectronic device of claim 6 wherein at least two signal pads are located close to a predetermined edge of the integrated circuit die.

10. The packaged microelectronic device of claim 6 wherein the signal pads on the integrated circuit die are wire bonded to the signal traces on the package substrate, and the ground pad on the integrated circuit die is wire bonded to the ground trace on the package substrate.

11. The packaged microelectronic device of claim 6, further comprising protective material to encapsulate the integrated circuit die.

12. The packaged microelectronic device of claim 6, further comprising a protective cap to encapsulate the integrated circuit die.

13. A package substrate, comprising:
a plurality of signal traces on a top surface of a substrate;
a ground trace on the top surface for at least one pair of signal traces;
a die paddle to support an integrated circuit die, said die paddle being connected directly with the ground trace;
a ground plane;
a via to connect the ground trace to the ground plane; and
a die paddle via to connect the die paddle to the ground plane.

14. The package substrate of claim 13, wherein the ground trace on the top surface for the pair of signal traces comprises a ground trace between the signal traces of the pair.

15. The package substrate of claim 13, wherein the die paddle being connected directly with the ground trace comprises the die paddle being connected directly with the ground trace on the top surface of the substrate.

16. The package substrate of claim 13, wherein the die paddle being connected directly with the ground trace comprises the die paddle being integrally formed with the signal trace.

17. The package substrate of claim 13, wherein said die paddle being connected directly with the ground trace comprises a conductive material between the ground trace and the signal trace.

18. A package substrate, comprising:
  a plurality of signal traces on a top surface of a substrate;
  a ground trace on the top surface for at least one pair of signal traces;
  a die paddle to support an integrated circuit die, said die paddle being connected directly with the ground trace;
  a power trace on the top surface of the substrate;
  a power plane; and
  a via to connect the power trace to the power plane.

19. The package substrate of claim 18, wherein the ground trace on the top surface for the pair of signal traces comprises a ground trace between the signal traces of the pair.

20. The package substrate of claim 18, wherein the die paddle being connected directly with the ground trace comprises the die paddle being connected directly with the ground trace on the top surface of the substrate.

21. The package substrate of claim 18, wherein the die paddle being connected directly with the ground trace comprises the die paddle being integrally formed with the signal trace.

22. The package substrate of claim 18, wherein said die paddle being connected directly with the ground trace comprises a conductive material between the ground trace and the signal trace.

* * * * *